(12) United States Patent
Kerr et al.

(10) Patent No.: US 9,473,141 B2
(45) Date of Patent: Oct. 18, 2016

(54) RECEIVING AN I/O SIGNAL IN MULTIPLE VOLTAGE DOMAINS

(71) Applicant: GLOBALFOUNDRIES INC., Grand Cayman (KY)

(72) Inventors: Michael K. Kerr, Johnson City, NY (US); William F. Lawson, Vestal, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 189 days.

(21) Appl. No.: 14/512,626

(22) Filed: Oct. 13, 2014

(65) Prior Publication Data

US 2016/0105180 A1  Apr. 14, 2016

(51) Int. Cl.
*H03K 19/0185* (2006.01)
*H03K 19/0175* (2006.01)
*H03K 19/00* (2006.01)

(52) U.S. Cl.
CPC .. *H03K 19/017509* (2013.01); *H03K 19/0002* (2013.01); *H03K 19/0013* (2013.01)

(58) Field of Classification Search
CPC ............. H03K 19/017509; H03K 19/018521; H03K 19/00315
USPC .......................................................... 326/81
See application file for complete search history.

(56) References Cited

U.S. PATENT DOCUMENTS

| | | | |
|---|---|---|---|
| 5,134,311 A * | 7/1992 | Biber | H03K 19/0005 326/30 |
| 5,532,621 A * | 7/1996 | Kobayashi | G05F 1/465 326/58 |
| 5,723,986 A | 3/1998 | Nakashiro et al. | |
| 5,969,554 A | 10/1999 | Chan et al. | |
| 6,262,599 B1 | 7/2001 | Coughlin, Jr. et al. | |
| 6,441,643 B1 | 8/2002 | Chan et al. | |
| 6,674,304 B1 * | 1/2004 | Matthews | H03K 17/167 326/63 |
| 7,301,386 B2 | 11/2007 | Chen et al. | |
| 7,382,168 B2 | 6/2008 | Bhattacharya et al. | |
| 7,477,086 B1 | 1/2009 | Maung | |

(Continued)

OTHER PUBLICATIONS

Sanchez, Hector et al. A Versatile 3.3/2.5/1.8-V CMOS I/O Driver Built in a 0.2-µm, 3.5-nm Tox, 1.8-V CMOS Technology, IEEE Journal of Solid-State Circuits, vol. 34, No. 11, pp. 1501-1511, Nov. 1999, IEEE, Piscataway, United States.

(Continued)

*Primary Examiner* — Don Le
(74) *Attorney, Agent, or Firm* — Scully Scott Murphy and Presser; Frank Digiglio

(57) ABSTRACT

Embodiments disclosed herein include an I/O module with multiple level shifters that establish a plurality of voltage domains. Using the level shifters, the I/O module converts data signals in a core logic voltage domain to data signals in an external voltage domain. In one embodiment, when transmitting data signals to an external device, the I/O module level shifts the data signals from a core logic voltage domain to a low voltage domain. The I/O module then level shifts the data signals from the low voltage domain to an intermediate voltage domain. The I/O module may further shift the data signals from the intermediate voltage domain to both a low voltage domain and a high voltage domain. Using the data signals from both of these domains, the I/O module outputs the data signals in a voltage domain corresponding to a communication technique used to transmit data to the external device.

13 Claims, 8 Drawing Sheets

(56) References Cited

U.S. PATENT DOCUMENTS

| | | | |
|---|---|---|---|
| 7,626,440 B1* | 12/2009 | Atesoglu | H03K 19/018528 326/81 |
| 8,174,288 B2 | 5/2012 | Dennard et al. | |
| 8,179,160 B1 | 5/2012 | Chauhan et al. | |
| 2007/0247190 A1* | 10/2007 | Chen | H03K 19/018521 326/81 |
| 2009/0045844 A1 | 2/2009 | Noh et al. | |
| 2012/0187998 A1 | 7/2012 | Jarrar et al. | |
| 2013/0169339 A1 | 7/2013 | Chen | |
| 2013/0265085 A1 | 10/2013 | Kerr et al. | |
| 2013/0271199 A1 | 10/2013 | Hsu et al. | |
| 2014/0078815 A1 | 3/2014 | Hollis | |
| 2014/0125398 A1 | 5/2014 | Li et al. | |

OTHER PUBLICATIONS

Lee, Tzung-Je, Wide-Range 5.0/3.3/1.8-V I/O Buffer Using 0.35-μm 3.3-V CMOS Technology, IEEE Transactions on Circuits and Systems—I: Regular Papers, vol. 56, No. 4, Apr. 2009, pp. 763-773, IEEE, Piscataway, United States.

Office Action dated Aug. 26, 2016 received in U.S. Appl. No. 14/512,554, 15 pages.

Office Action dated Sep. 1, 2016 received in U.S. Appl. No. 14/569,047, 19 pages.

\* cited by examiner

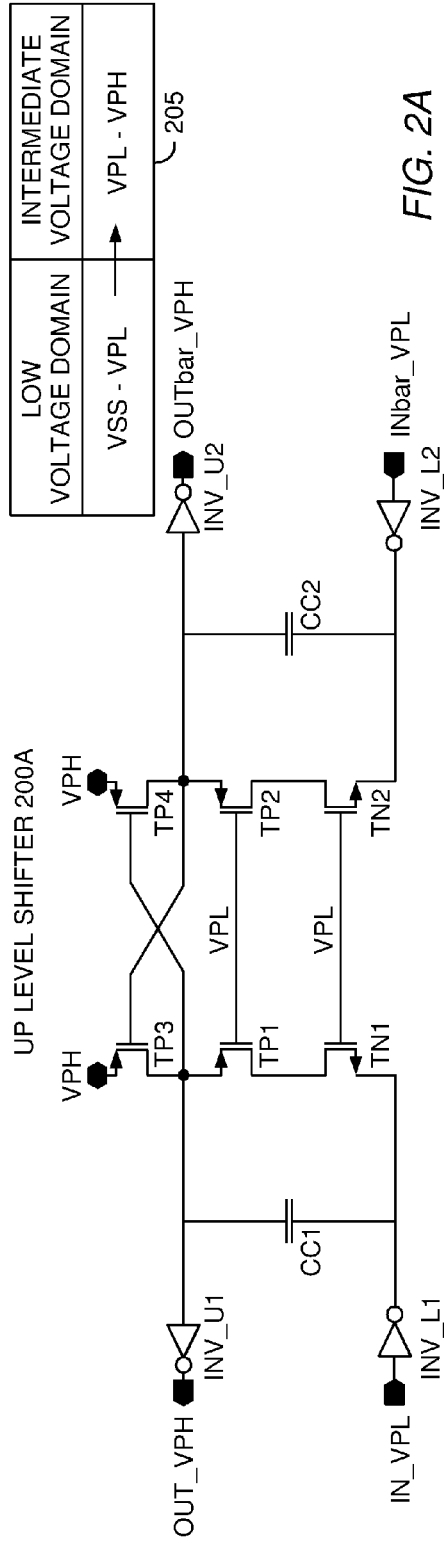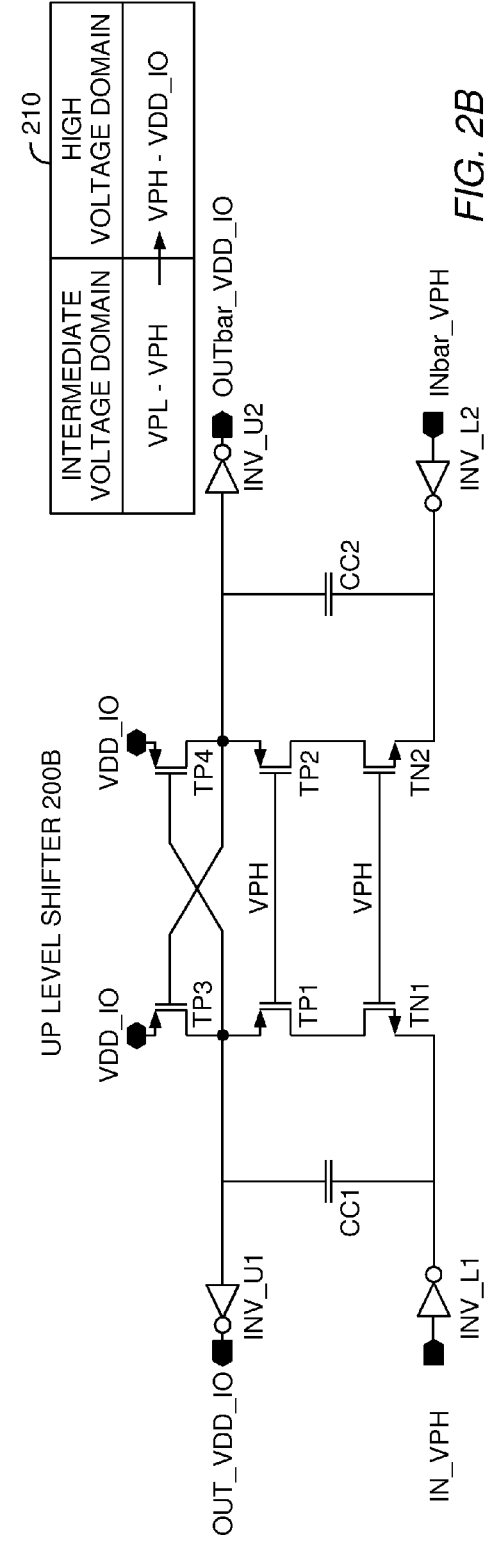
FIG. 2A
FIG. 2B

US 9,473,141 B2

RECEIVING AN I/O SIGNAL IN MULTIPLE VOLTAGE DOMAINS

BACKGROUND

The present disclosure relates to interfacing an integrated circuit (IC or chip) with an external device, and more specifically, to level shifting an (input/output) I/O data signal to an intermediate voltage domain.

As silicon technology advances, the sustainable voltage for CMOS devices continues to decrease. While decreasing operating voltages reduce power and allow for denser logic, chip to chip communication via I/O circuits may still need to support legacy interface voltages (e.g., 3.3V LVTTL JEDEC Spec JESD8-B). However, 22 nm technology and future technology typically support 1.5V and lower devices.

One solution is to stack output devices which enable lower power chips to communicate using the legacy interface voltages. While stacking two output devices permits chips made in technologies such as 45 or 32 nm that support 1.8V devices to communicate with legacy voltages, this technique does not work for 22 nm and future fabrication techniques.

SUMMARY

One embodiment of the present disclosure is a method that includes receiving a first data signal in a first voltage domain at a input/output (I/O) pad, wherein the I/O pad is electrically connected to a node that is between a p-type transistor and an n-type transistor. The method includes applying a gate signal to both gates of the p-type and n-type transistors and controlling the gate signal such that a voltage of the gate signal follows a voltage of the first data signal unless the voltage of the first data signal exceeds an upper limit voltage and unless the voltage of the first data signal falls below a lower limit voltage, where the upper and lower limit voltages defining an intermediate voltage domain. The method includes outputting a second data signal responsive to receiving the gate signal at a receiver circuit and converting the second data signal outputted from the receiver circuit into a second voltage domain, where the converted data signal carries the same data as the first data signal.

Another embodiment of the present disclosure is an I/O module that includes an n-type transistor and a p-type transistor where a drain of the p-type transistor is coupled to a drain of the n-type transistor. The I/O module also includes an I/O pad electrically coupled to the drains of the p-type and n-type transistors where the I/O pad is configured to receive a first data signal in a first voltage domain. The I/O module also includes a voltage feedback control circuit configured to apply a gate signal to both gates of the p-type and n-type transistors and control the gate signal such that a voltage of the gate signal follows a voltage of the first data signal unless the voltage of the first data signal exceeds an upper limit voltage and unless the voltage of the first data signal falls below a lower limit voltage, where the upper and lower limit voltages defining an intermediate voltage domain. The I/O module also includes a receiver circuit configured to output a second data signal responsive to receiving the gate signal from the voltage feedback circuit and a level shifter configured to covert the second data signal into a second voltage domain, where the converted data signal carries the same data as the first data signal.

Another embodiment of the present disclosure is an integrated circuit that includes core logic and an I/O module communicatively coupled to the core logic. The I/O module includes an n-type transistor and a p-type transistor where a drain of the p-type transistor is coupled to a drain of the n-type transistor. The I/O module also includes an I/O pad electrically coupled to the drains of the p-type and n-type transistors where the I/O pad is configured to receive a first data signal in a first voltage domain. The I/O module includes a voltage feedback control circuit configured to generate a gate signal to control both gates of the p-type and n-type transistors and control the gate signal such that a voltage of the gate signal follows a voltage of the first data signal unless the voltage of the first data signal exceeds an upper limit voltage and unless the voltage of the first data signal falls below a lower limit voltages, where the upper and lower limit voltage defining an intermediate voltage domain. The I/O module also includes a receiver circuit configured to output a second data signal responsive to receiving the gate signal from the voltage feedback circuit and a level shifter configured to covert the second data signal into a second voltage domain, where the converted data signal carries the same data as the first data signal.

BRIEF DESCRIPTION OF THE SEVERAL VIEWS OF THE DRAWINGS

FIGS. 2A and 2B are circuit diagrams of an up level shifter, according to one embodiment described herein.

Figure 1:
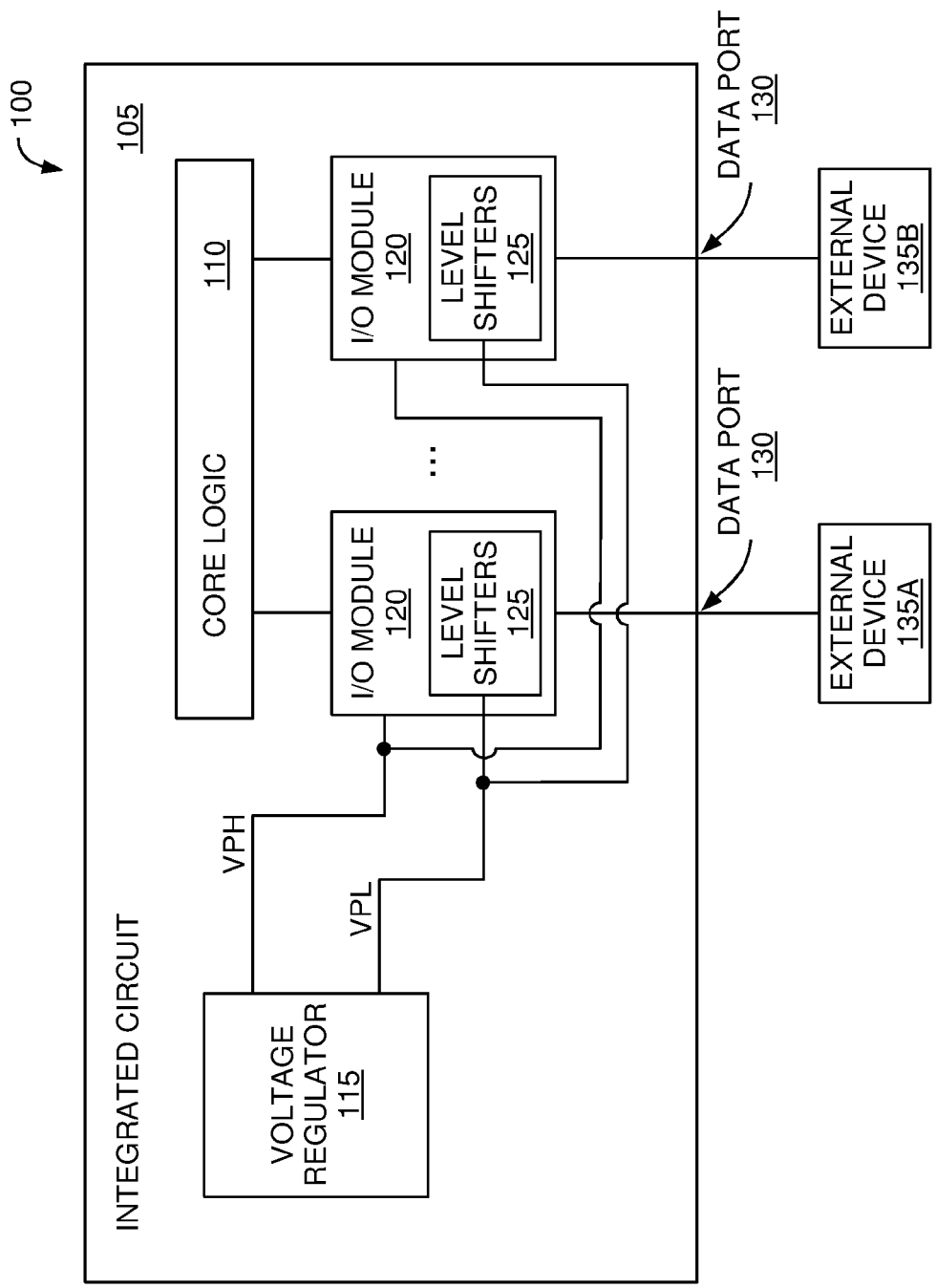
FIG. 1 is a block diagram of a communication system, according to one embodiment described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

To support legacy, high-voltage communication techniques, an I/O module may include multiple level shifters that establish a plurality of voltage domains. For example, an IC may include core logic that uses small voltage signals but, in order to communicate with an external device, the IC may need to convert these small voltage signals into larger voltage signals. Stated differently, the IC converts data signals in a core logic voltage domain used by the IC to data signals in an external voltage domain. To do so, the I/O module may use at least three voltage domains—e.g., a low voltage domain, intermediate voltage domain, and a high voltage domain.

In one embodiment, when transmitting data signals received from the IC's core logic to the external device, the I/O module level shifts the data signals from the core logic voltage domain to the low voltage domain. The I/O module then level shifts the data signals from the low voltage domain to the intermediate voltage domain. To generate data signals suitable for the external device, the I/O module level shifts the data signals from the intermediate voltage domain to both the low voltage domain and the high voltage domain. Using the data signals from both of these domains, a driver in the I/O module outputs the data signals in a voltage domain corresponding to the external device (e.g., a legacy, high-voltage domain). In this manner, the I/O module uses three stacked voltage domains in order to convert core logic data signals into data signals suitable for a high-voltage communication technique (e.g., a chip-to-chip communication technique).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a wave-guide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 is a block diagram of a communication system 100, according to one embodiment described herein. As shown, the communication system 100 includes IC 105 and external devices 135A and 135B which may be, for example, separate ICs. IC 105 includes core logic 110, voltage regulator 115, and I/O modules 120. The core logic 110 may include logic/circuitry that performs the intended function of the IC. For example, the IC 105 may be a general purpose processor, and as such, the core logic 110 may include multiple processing cores or multiple processing pipelines. Alternatively, the IC 105 may be an ASIC where the core logic 110 includes the logic for performing the ASIC's intended function. In one example, the core logic 110 may include all circuitry and logic gates that operate in the same voltage domain (i.e., the core logic voltage domain).

Generally, a voltage domain defines a voltage range between a minimum voltage and a maximum voltage. The data signals in the voltage domain are limited by these minimum and maximum voltages. For example, the data signals may oscillate between these voltages. For the core logic voltage domain, the minimum voltage is referred to herein as VSS and the maximum voltage is referred to as VDD. Examples of voltage ranges of the core logic voltage domain include VSS (system ground) to 1.5V, VSS to 1.2V, and VSS to 0.9V. Of course as fabrication techniques improve, the core logic voltage domain may reduce further to even smaller voltage ranges.

To communicate with the external devices 135, the core logic 110 is coupled to the I/O modules 120 which permit the core logic 110 to transmit data to the external devices 135 and receive data from the external devices 135. To convert the data signals of the core logic voltage domain to the voltage domain used by the external devices 135 (or the communication technique used transfer data between IC 105 and the external devices 135), the I/O modules 130 include a plurality of level shifters 125 which convert data signals into three different voltage domains—i.e., a low voltage domain, an intermediate voltage domain, and a high voltage domain. A more detailed explanation of the function and arrangement of the level shifters 125 is provided later. Nonetheless, using the level shifters 125, the I/O modules convert data signals from the core logic voltage domain to a voltage domain used at data ports 130 which couple to the external devices 135. This voltage domain is referred to herein as the external voltage domain and ranges from VSS to VDD_IO. For example, if the 3.3V LVTTL JEDEC Spec JESD8-B is used to establish communication between IC 105 and the external devices 135, then the external voltage domain ranges from VSS (system ground) to 3.3V.

Although two I/O modules 120 are shown, IC 105 may include any number of these modules 120. The I/O modules 120 may connect to a wide variety of different external devices 135 and be configured to convert the data signals from the core logic voltage domain to different external voltage domains. That is, the external voltage domains at the data ports 130 may have different voltage ranges. Furthermore, multiple I/O modules 120 may be coupled to the same external device 135 rather than each I/O module 120 connecting to a respective device 135 as shown here.

To generate the three voltage domains used by the I/O modules 120, the voltage regulator 115 outputs two voltages—VPL and VPH—where VPL represents the a low protection voltage and VPH represents a high protection voltage. The voltage regulator 115 provides VPL and VPH to each of the I/O modules 120 in the IC 105, and more specifically, to the level shifters 125 within the modules 120. In one embodiment, IC 105 has multiple voltage regulators 115 that provide VPL and VPH to different groups of I/O modules 120—e.g., each voltage regulator 115 may provide VPL and VPH to six I/O modules 120.

Although the communication system 100 includes I/O modules 120 and level shifters 125 on an integrated circuit 105, the embodiments herein are not limited to such. That is, using three stacked voltage domains (i.e., the low, intermediate, and high voltage domains) to convert data signals may apply to other systems that do not include integrated circuits.

FIGS. 2A and 2B are circuit diagrams of an up level shifter, according to one embodiment described herein. For convenience, this disclosure uses specific voltages to refer to the different voltage domains described herein. The minimum and maximum voltages for each of the voltage domains described above are provided in the following table.

TABLE 1

| Voltage Domain | Minimum Voltage | Maximum Voltage |
| --- | --- | --- |
| Core Logic Voltage Domain | VSS | VDD |
| Low Voltage Domain | VSS | VPL |
| Intermediate Voltage Domain | VPL | VPH |
| High Voltage Domain | VPH | VDD_IO |
| External Voltage Domain | VSS | VDD_IO |

In the embodiments that follow, it is assumed that VSS is system ground and is the smallest magnitude voltage. Moreover, the magnitude of VPH is defined as being greater than the magnitude of VPL, while VDD_IO is assumed to be the voltage with the greatest magnitude. In one embodiment, VPL is selected to be one-third of VDD_IO and VPH is selected to be two-thirds of VDD_IO but this is not a requirement. Based on these relationships, Table 1 illustrates that the core logic voltage domain, low voltage domain, intermediate voltage domain, and high voltage domain are different subsets of the external voltage domain—i.e., the first four voltage domain defined voltage ranges that are within the voltage range of the external voltage domain. Furthermore, in this example, the low voltage domain, intermediate voltage domain, and high voltage domain define voltage ranges that do not overlap. In contrast, the core logic voltage domain overlaps with the low voltage domain and may also overlap the intermediate and high voltage domains if, for example, VDD is greater than VPL and VPH.

FIG. 2A illustrates an up level shifter 200A that converts, as shown by table 205, data signals from the low voltage domain to the intermediate voltage domain. The level shifter 200A includes two input pads that receive complementary signals IN_VPL and INbar_VPL. In the circuit diagrams that follow, the maximum voltage is used to identify the voltage domain that contains the data signal. That is, a signal labeled "_VPL" indicates that the data signals are in the low voltage domain, "_VPH" indicates that the data signals are in the intermediate voltage domain, and "_VDD_IO" indicates that the data signals are in the high voltage domain. As such, because the input signals are labeled IN_VPL, the data signals received at the inputs of inverters INV_L1/L2 range between VSS and VPL—i.e., the low voltage domain. The outputs of inverters INV_U1/U2 provide two output signal OUT_VPH and OUTbar_VPH which are complementary data signals in the intermediate voltage domain.

To up-shift the received data signals into the intermediate voltage domain, level shifter 200A includes two different signal paths. The first signal path (referred to herein as the low-frequency path) includes the transistors TP1, TP2, TN1, and TN2 which, with the aid of transistors TP3 and TP4, convert the input signals from the low voltage domain to the intermediate voltage domain. In some applications, however, this low-frequency path does not have a response time sufficient for high-speed data signals (e.g., signals greater than 200 MHz). In one embodiment, the low-frequency path generates asymmetric rise and fall times in the data signals. For example, the converted data signal may rise faster than it falls (or vice versa) by several nanoseconds. This asymmetry may mean that low-frequency path is unable to provide output data signals that are accurate copies of the data signals received at the input of inverters INV_L1/L2.

To facilitate high-speed data signals, level shifter 200A includes a second signal path (referred to herein as a high-frequency path) that includes the path between the output of the inverter INV_L1 (or L2), the capacitor CC1 (or CC2), and the input of inverter INV_U1 (or U2). If CC1 and CC2 were omitted, the output of INV_L1 passes through TN1 and TP1 to drive inverter INV_U1 while the output of INV_L2 passes through TN2 and TP2 to drive INV_U2. Because the capacitors CC1 and CC2 are charged to a voltage, when the input signal at IN_VPL is rising, the output of INV_U1 rises faster than it would if capacitor CC1 was omitted from the level shifter 200A. Stated differently, the high-frequency path provides a bypass path for high-frequency signals which uses the capacitors CC1 and CC2 to avoid the low-frequency path. Moreover, the value of the capacitors CC1 and CC2 may be selected to select which data signals are low frequency data signals, and thus, are routed through the low-frequency path, and which data signals are high frequency data signals and are routed through the high-frequency path. Moreover, adding the high-frequency paths allow the transistors TP1, TP2, TN1, and TN2 to be smaller than they otherwise would if the high-frequency paths were omitted thereby reducing the load and improving switching.

FIG. 2B illustrates an up level shifter 200B that converts, as shown by table 210, signals from the intermediate voltage domain to the high voltage domain. Structurally, level shifter 200B is the same as level shifter 200A shown in FIG. 2A. However, the power voltages, gate voltages, and input/output signals for the level shifters 200 are different. As shown, the input signals IN_VPH and INbar_VPH of level shifter 200B are complementary data signals in the intermediate voltage domain and the output signals OUT_VDD_IO and OUTbar_VDD_IO are complementary data signals in the high voltage domain. To perform this conversion, instead of using VPH as the power voltage at the sources of transistors TP3 and TP4, VDD_IO is used. Moreover, the gate voltages for transistors TP1, TP2, TN1, and TN2 are set at VPH rather than VPL as shown in FIG. 2A. By using these different voltages, the first and second signal paths discussed above convert low-speed or high-speed data signals from the intermediate voltage domain to the high voltage domain.

Figure 3A:
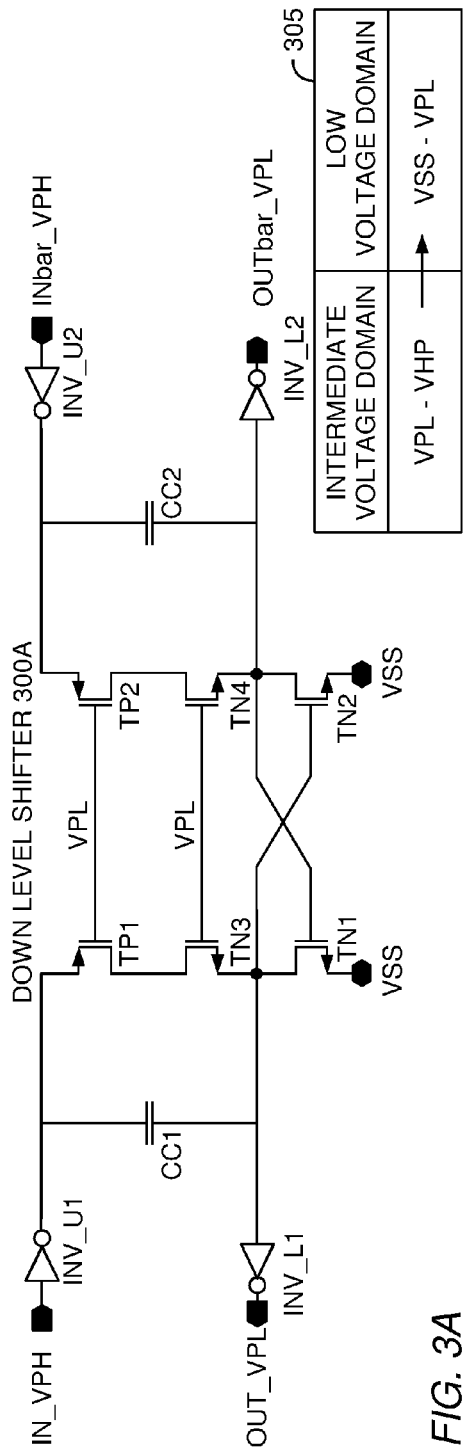
FIGS. 3A and 3B are circuit diagrams of a down level shifter, according to one embodiment described herein.
Figure 3B:
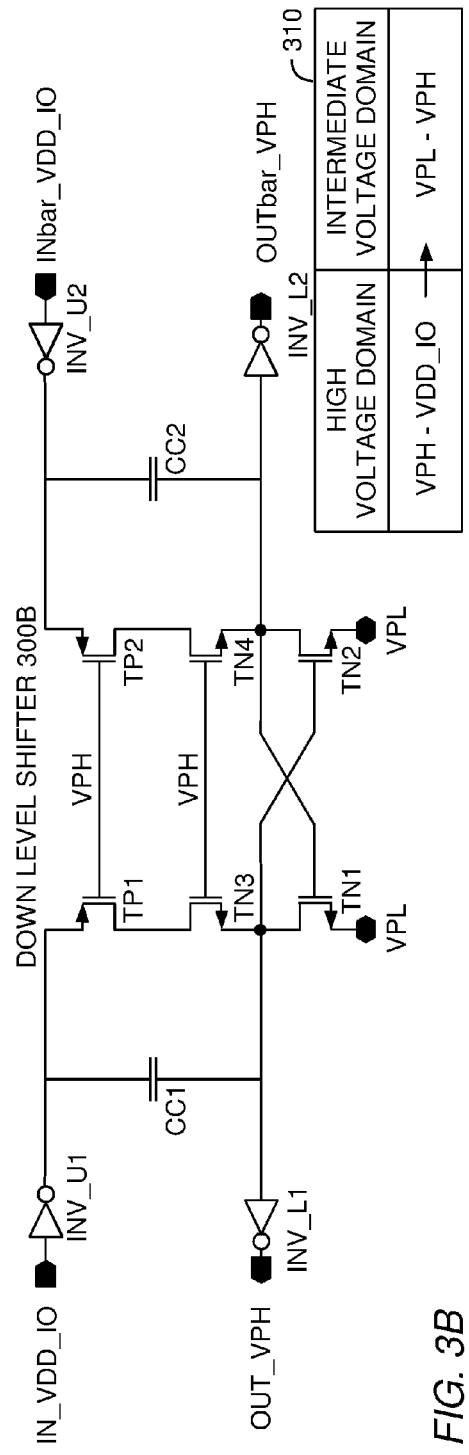

FIGS. 3A and 3B are circuit diagrams of a down level shifter, according to one embodiment described herein. Specifically, FIG. 3A illustrates a down level shifter 300A with a circuit arrangement configured to convert input data signals IN_VPH and INbar_VPH in the intermediate voltage domain to data signals OUT_VPL and OUTbar_VPL in the low voltage domain. This conversion is shown graphically in table 305. To shift the data signals, level shifter 300A includes a low-frequency data path that includes the transistors TP1, TP2, TN3, and TN4. Because this low-frequency path may generate asymmetric rise and fall times when shifting high-speed data signals, the level shifter 300A includes respective high-frequency signal paths between the inverters INV_U1/2 and inverters INV_L1/2 through the capacitors CC1 and CC2. As discussed above, adding the high-frequency paths allows the transistors TP1, TP2, TN1, and TN2 to be smaller than they otherwise would be in the absence of the high-frequency paths thereby reducing the load and improving switching.

FIG. 3B illustrates a down level shifter 300B with the same structure as down level shifter 300A but is operated using different power and gate voltages. That is, instead of driving the VSS voltage onto the sources of the transistors TN1 and TN2 as shown in FIG. 3A, in level shifter 300B the VPL voltage is used. Additional, the gates of transistors TP1, TP2, TN3, and TN4 are driven to VPH instead of VPL. As such, when receiving data signals IN_VDD_IO and INbar_VDD_IO in the high voltage domain at the input interfaces, the level shifter 300B converts these data signals into the intermediate voltage domain as shown by table 310. These shifted data signals are then provided as output signals OUT_VPH and OUTbar_VPH.

Figure 4:
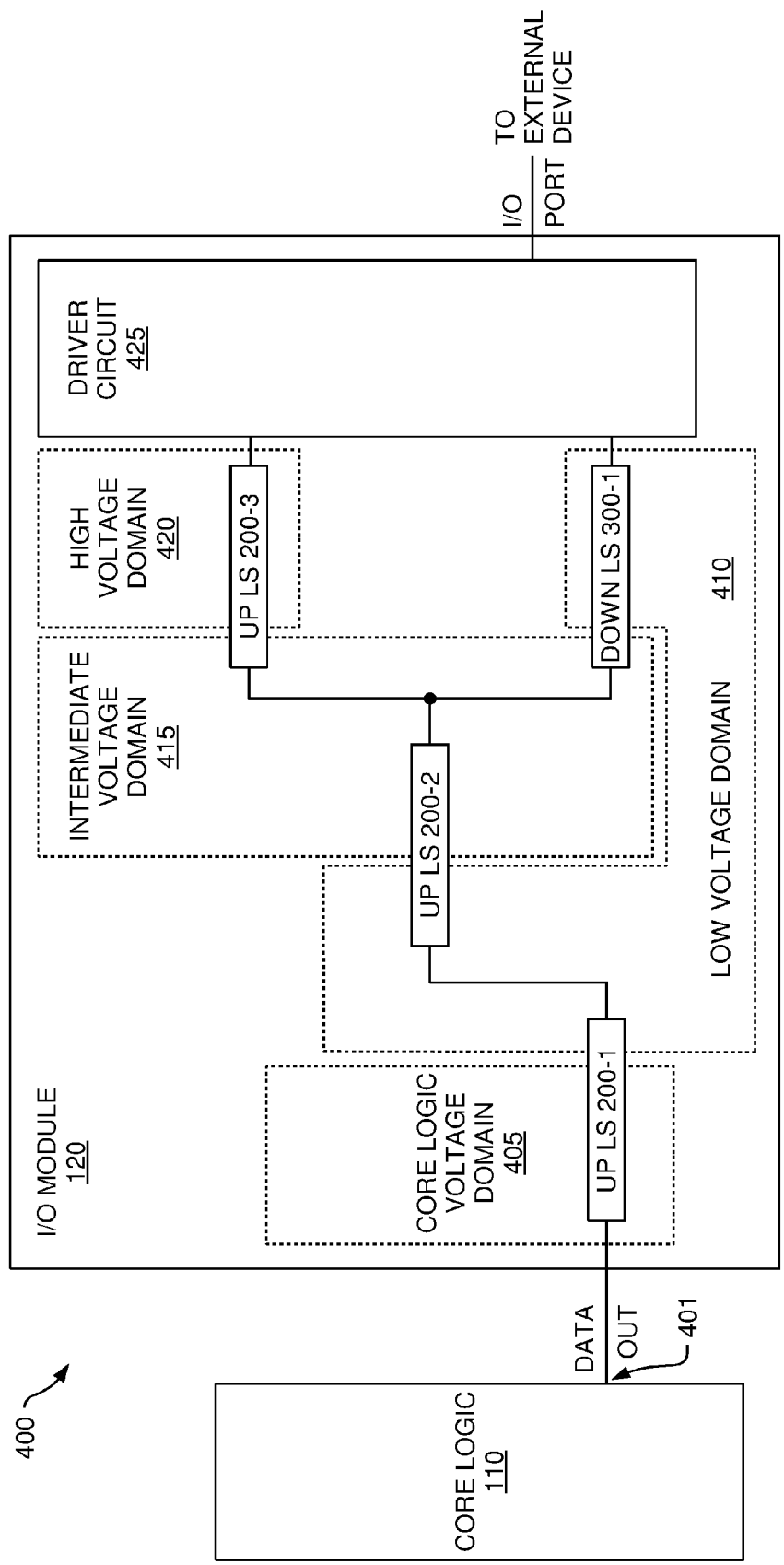
FIG. 4 is a block diagram of a communication system for level shifting a data signal into different voltage domains, according to one embodiment described herein.
Figure 5:
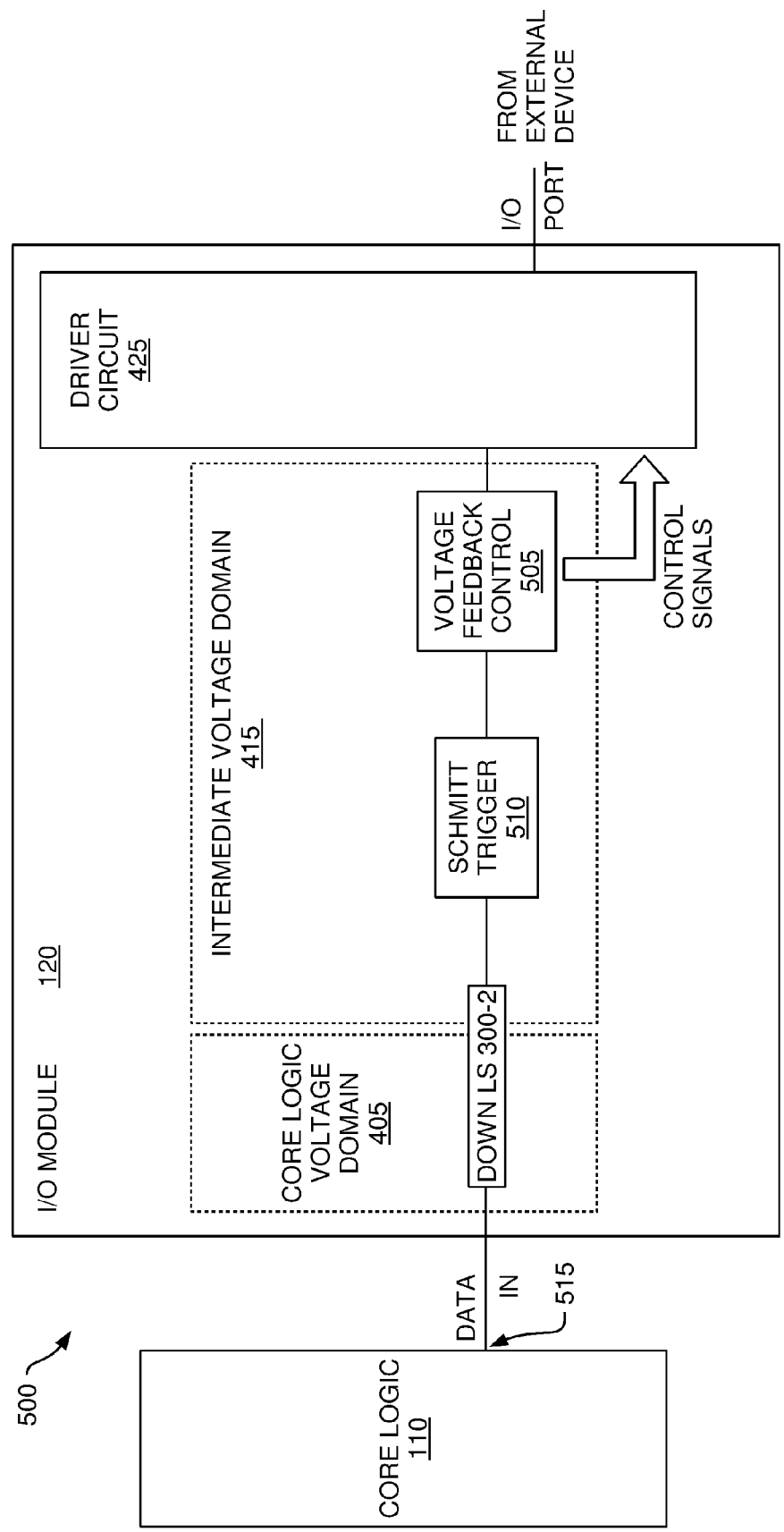
FIG. 5 is a block diagram of a communication system for level shifting a received data signal into different voltage domains, according to one embodiment described herein.

FIG. 4 is a block diagram of a communication system 400 for level shifting an output signal into different voltage domains, according to one embodiment described herein. As shown, system 400 includes core logic 110 and I/O module 120 which may be located on the same IC or located on different ICs or devices. Generally, the data signals flow from the core logic 110, through the I/O module 120, and out to an external device. As such, system 400 illustrates only one-directional traffic flow between the core logic 110 and the external device. FIG. 5, on the other hand, illustrates how data is transmitted in the reverse direction—i.e., from the external device to the core logic 110.

The data signals transmitted from the core logic 110 to the I/O module 120 using data out interface 401 are in the core logic voltage domain 405—i.e., the data signals range from VSS to VDD. As such, the input interface of up level shifter (LS) 200_1 is in the core logic voltage domain 405. The up LS 200_1 then converts the data signals from the core logic domain 405 to the low voltage domain 410. That is, the output of LS 200_1 is the data signals in the low voltage domain 410.

Using up LS 200_2, the I/O module 120 shifts the data signals from the low voltage domain 410 to the intermediate voltage domain 415. These data signals are the split and sent to both up LS 200_3 and down LS 300_1. The up LS 200_3 shifts the data signals from the intermediate voltage domain 415 to the high voltage domain 420. The down LS 300_1, in contrast, shifts the data signals back down to the low voltage domain 410. As such, the data signals outputted by down LS 300_1 are the same, or substantially similar to, the data signals outputted by the up LS 200_1. Stated differently, the data signals are shifted by LS 200_2 from the low voltage domain 410 to the intermediate voltage domain 415 and then subsequently shifted back down from the intermediate voltage domain 415 to the low voltage domain 410. Although this may seem unnecessary since the output of LS 200_1 could be forwarded to the input of driver circuit 425 thereby omitting the down LS 300_1, the advantage of the arrangement shown here is that the down LS 300_1 mirrors the delay introduced on the signal by the up LS 200_3. That is, if the output of LS 200_1 was directly forwarded to the input of the driver circuit 425, because of the delay introduced by LS 200_2 and 200_3, the arriving data signals in the high voltage domain 420 would not arrive at the circuit 425 as the corresponding data signals in the low voltage domain 410. Moreover, using other delay elements such as inverters to mirror the delay introduced by LS 200_2 and 200_3 may be infeasible and take up too much real estate on the IC. However, by first shifting the data signal to the intermediate voltage domain 415 and then down shifting those signals back into the low voltage domain 410, the I/O module 120 can provide data signals that are substantially aligned, but in different voltage domains, at the inputs of the driver circuit 425.

As will be described in more detail below, the driver circuit 425 uses the data signals received from LS 200_3 in the high voltage domain 420 (e.g., VPH to VDD_IO) and the data signals received from LS 300_1 in the low voltage domain 410 (e.g., VSS to VPL) to generate data signals in the external voltage domain (e.g., VSS to VDD_IO). As such, in this manner, the same data outputted by the core logic 110 is forwarded to the external device except that the data signals conveying this data is now in the external voltage domain (e.g., VSS to 3.3V) rather than the core logic voltage domain 405 (e.g., VSS to 1.2V).

FIG. 5 is a block diagram of a communication system 500 for level shifting a received signal into different voltage domains, according to one embodiment described herein. Unlike in FIG. 4 where data flows from the core logic 110 to the external device, in system 500, data flows from the external device to the core logic 110. In this case, the I/O module 120 converts the data signals received from the external device from the external voltage domain to data signals in the core logic voltage domain 405. As will be described in more detail later, a voltage feedback control 505 shifts received data signals from the external voltage domain to the intermediate voltage domain 415 and transmits these shifted data signals to a Schmitt trigger 510. In one embodiment, the values of VPL, VPH, and VDD_IO are selected such that the voltage feedback control 505 receives the data signals from the external device in the intermediate voltage domain which is the middle portion of the external voltage domain. Stated differently, the voltage range of the intermediate voltage domain (VPL-VPH) is the middle region of the voltage range of the external voltage domain (VSS-VDD_IO). For example, VPL may be one-third the value of VDD_IO while VPH is two-thirds the value of VDD_IO. By receiving in the intermediate voltage domain rather than in the high or low voltage domains, the I/O module 120 is able to avoid additional complexity needed in order to re-shape signals that become skewed when received in voltage domains that are not centered with the external voltage domain. A more detailed explanation of how the driver circuit 425 may aid the voltage feedback control 505 to receive the signals in the intermediate voltage domain 415 is provided below in FIGS. 6A and 6B.

The voltage feedback control 505 forwards the data signals to a Schmitt trigger 510. In one embodiment, the Schmitt trigger 510 is used to reduce the noise in the received data signals. Moreover, although the trigger 510 is shown as operating in the intermediate voltage domain 415, in other embodiments it may be advantageous to convert the received data signals into the high or low voltage domains before sending these signals to the Schmitt trigger 510. Further still, in one embodiment, the data signals outputted from the voltage feedback control 505 are shifted into both the high and low voltage domains and are passed through respective Schmitt triggers 510 in each of these domains. Although a Schmitt trigger 510 is shown, the present disclosure is not limited to such. For example, the Schmitt trigger may be replaced by a receive buffer that is in the intermediate voltage domain. As such, the output of the voltage feedback control 505 may be fed into a receiver circuit which may be a Schmitt trigger or a buffer whose output is coupled to LS 300_2.

The output of the Schmitt trigger 510 is provided to the down LS 300_2 which shifts the data signals from the intermediate voltage domain 415 to the core logic voltage domain 405. The down-shifted data signals are then provided to the core logic 110 via data interface 515. In this manner, data received at the external voltage domain is converted into the intermediate voltage domain 415 that may be centered in the external voltage domain before being converted to the core logic voltage domain 405.

Figure 6A:
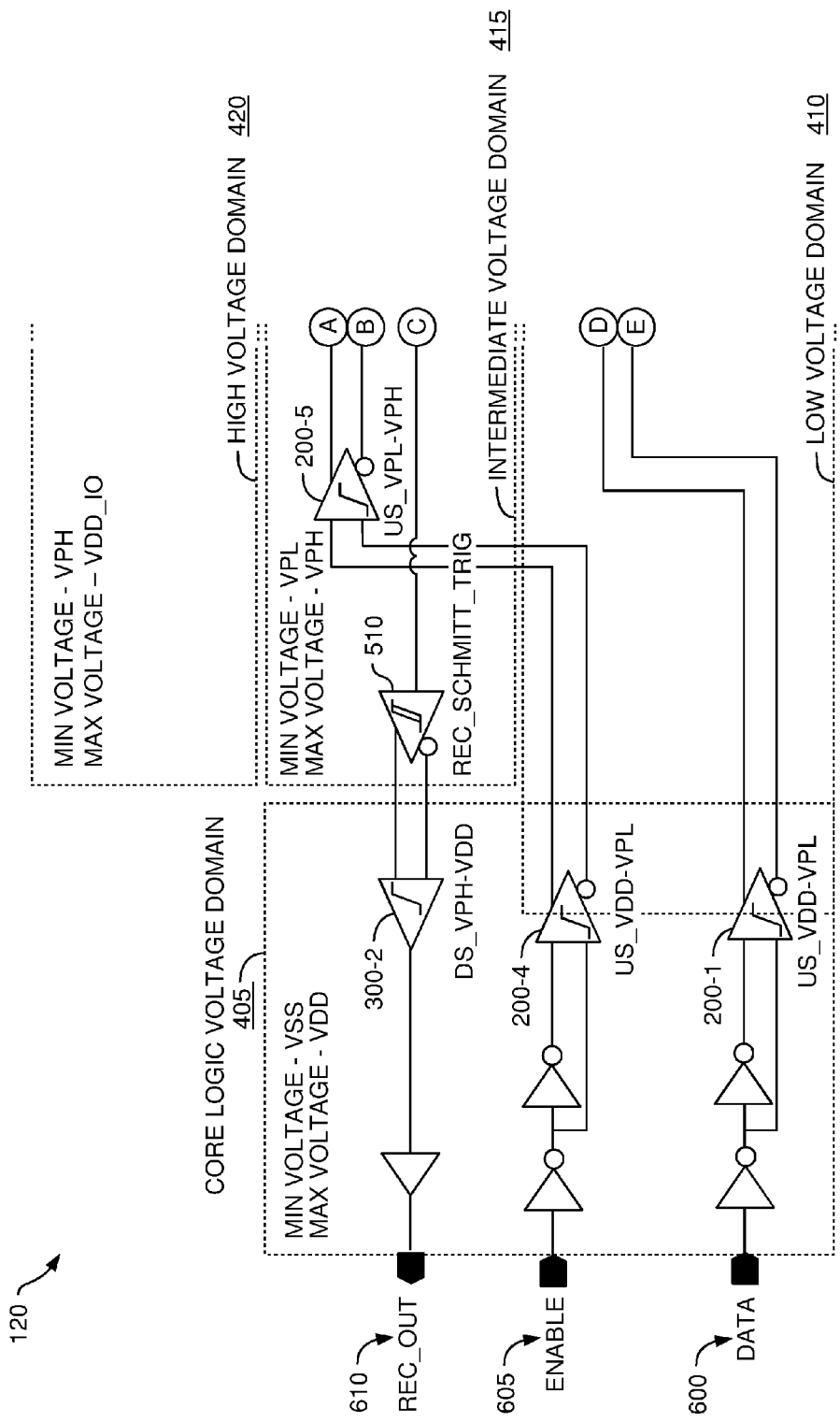
FIGS. 6A and 6B illustrate a circuit diagram of a communication system for level shifting I/O signals into different voltage domains, according to one embodiment described herein.
Figure 6B:
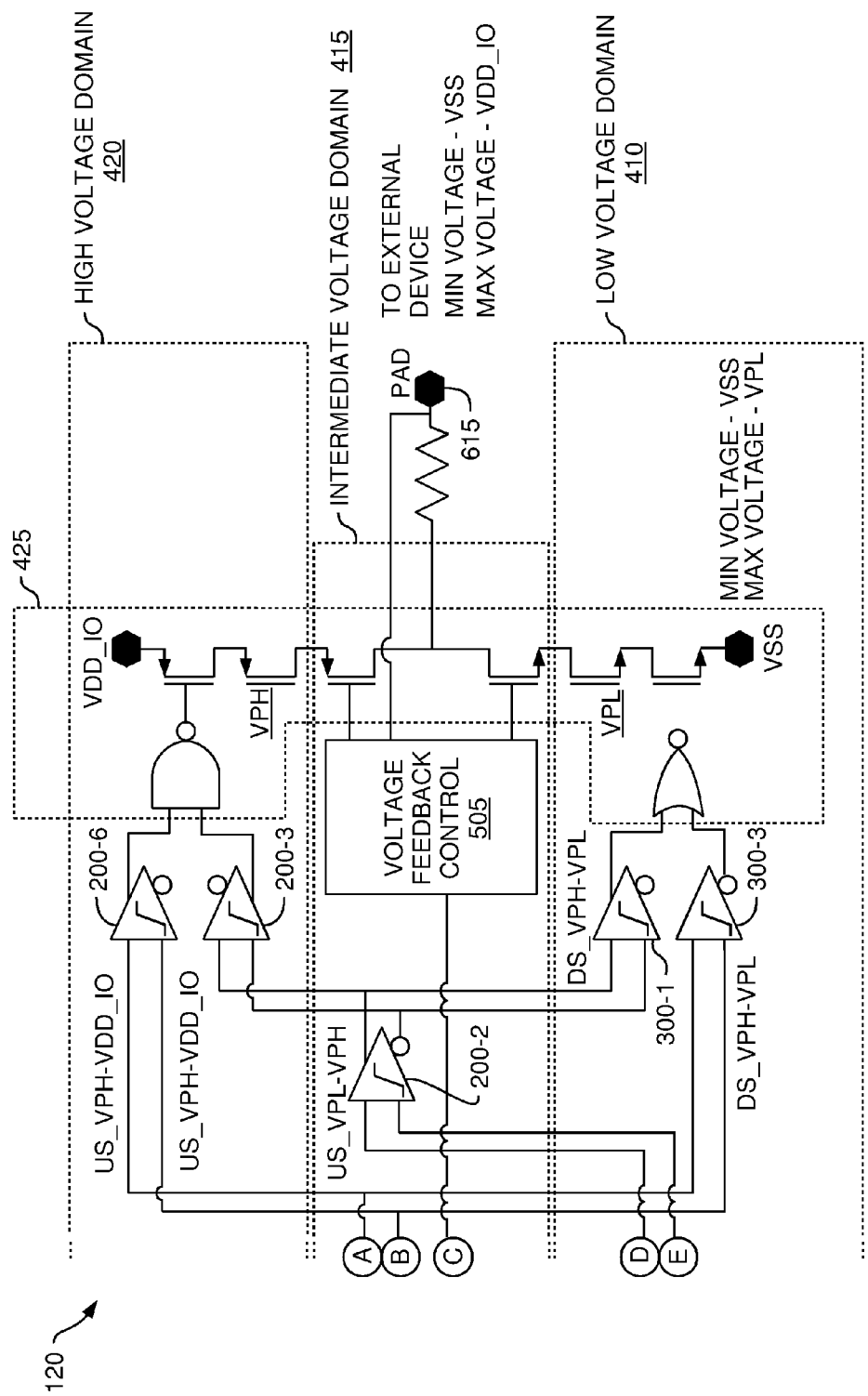

FIGS. 6A and 6B illustrate a circuit diagram of the I/O module 120 for level shifting I/O signals into different voltage domains, according to one embodiment described herein. More specifically, FIGS. 6A and 6B include the circuitry that may be used to perform the transmitting and receiving functions shown in FIGS. 4 and 5. That is, the circuitry in I/O module 120 is capable of both transmitting data from the core logic to the external device and transmitting data from the external device to the core logic. As such, the same level shifters shown in FIGS. 4 and 5 are provided with the same reference numbers here (e.g., level shifters 200_1, 200_2, 200_3, 300_1, and 300_2).

The I/O module 120 receives data signals from the core logic on data pad 600. The I/O module then uses the two inverters to generate complementary signals that are then provided to level shifter 200_1. As discussed in FIG. 4, level shifter 200_1 shifts the complementary data signals from the core logic voltage domain 405 into the low voltage domain 410. The resulting data signals are received by level shifter 200_2 which converts the signals into the intermediate voltage domain 415. The output of level shifter 200_2 is coupled to both up level shifter 200_3 and down level shifter 300_1 which output data signals in the high voltage domain and low voltage domain, respectively. As discussed in FIG. 4, converting the data signals from the low voltage domain to the intermediate voltage domain only to then reconvert the signals to the low voltage domain may be performed to align or synchronize the data signals in the different voltage domains without having to use other delay elements (e.g., a daisy chain of inverters). However, other types of delay elements (e.g., inverters) may still be used to synchronize the signals if the output of level shifter 200_3 and level shifter 300_1 are not sufficiently aligned.

The driver circuit 425 includes a NAND gate that receives the data signals in the high voltage domain 420 and a NOR gate that receives the data signals in the low voltage domain 410. Moreover, in order to tri-state the circuit 425, the I/O module 120 includes an enable pad 605 that receives an enable signal from, e.g., the core logic. The I/O module level shifts the received enable signal in the same manner as the data signal. As shown, an up level shifter 200_4 converts the enable signal to the low voltage domain 410, while up level shifter 200_5 converts the enable signal into the intermediate voltage domain 415. To maintain alignment, the down level shifter 300_3 converts the enable signal back into the low level domain 410 while the up level shifter 200_6 converts the enable signal into the high voltage domain 420. Using the NAND and NOR logic, the driver circuit 425 uses the enable signal to drive the data signals onto the output pad 615 only if the enable signal is high—i.e., the circuit 425 operates in the driver mode. Because the source of the uppermost transistor in the driver circuit 425 is coupled to VDD_IO and the source of the lowermost transistor is coupled to VSS, the output data signal is in the external voltage domain (i.e., VSS to VDD_IO). Furthermore, for the data signals, only the normal data signals outputted from level shifters 200_3 and 300_1 are provided to the NAND and NOR gates (i.e., the complementary data signals are ignored). In contrast, for the enable signal, the normal enable signal is provided to the NAND gate while the complementary enable signal is provided to the NOR gate.

If the enable signal is low, the circuit 425 does not drive data signals onto pad 615—i.e., the circuit 425 operates in an idle or receiver mode. Meanwhile, the voltage feedback control 505 and Schmitt trigger 510 can receive data signals from the external device on the pad 615. When receiving data, the voltage feedback control 505 provides control signals (i.e., gate signals) that control the middle two transistors in the driver circuit 425. Stated differently, the control signals force the gates of the middle two transistors to follow the voltage at the output pad 615 except when (i) the voltage at the pad 615 falls below VPL in which case the voltage feedback control 505 fixes the control signals at VPL (the minimum voltage in the intermediate voltage domain 415) and (ii) the voltage at pad 615 rises above VPH in which case the voltage feedback control 505 fixes the control signals at VPH (the maximum voltage in the intermediate voltage domain 415). In this way, the voltage feedback control 505 permits the voltage of the control signals to follow the voltage on pad 615 unless the voltage at pad 615 goes below VPL or above VPH, in which case the voltage is clipped and held at either VPL or VPH.

Moreover, in this embodiment, the three outputs of the feedback control 505 (i.e., the two gate control signals and the output to node C which is the input to the Schmitt trigger 510) are all the same voltage. That is, the output signals follow the voltage on pad 615 except when the pad voltage exceeds VPH or falls below VPL in which case the voltage is clipped. In one embodiment, the voltage feedback control 505 and the Schmitt trigger 510 function as a receiver that receives the external data in the intermediate voltage domain. As described above, complexity of the driver/receiver circuit 425 is reduced if the voltage range of the intermediate voltage domain 415 is centered within the external voltage range relative to receiving in a non-centered voltage range. One embodiment of a voltage feedback control circuit 505 is provided in U.S. patent application Ser. No. 13/443,209 (Publication No. US 2013/0265085) entitled "IMPLEMENTING VOLTAGE FEEDBACK GATE PROTECTION FOR CMOS OUTPUT DRIVERS" which is herein incorporated by reference in its entirety. The output of the Schmitt trigger 510 is then converted from the intermediate voltage domain 415 to the core logic voltage domain 405 using level shifter 300_2. The I/O module 120 data signals are transmitted to the core logic using the interface 610.

Figure 7:
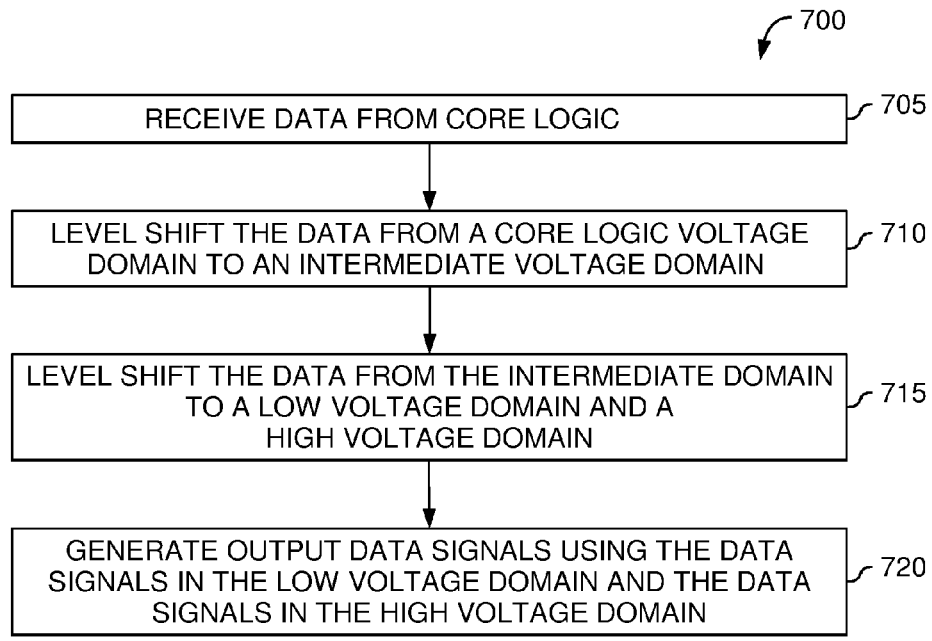
FIG. 7 is a flowchart for level shifting a data signal into different voltage domains, according to one embodiment described herein.

FIG. 7 is a flowchart 700 for level shifting an output signal into a different voltage domain, according to one embodiment described herein. At block 705, the I/O module receives a data signal from core logic of an IC. As described above, the voltage domain used by the core logic may be different than the voltage domain of a communication technique used by the I/O module to transmit the data signal to a different device. Although in the present disclosure the different device is described as being external to the IC, this is not a requirement. For example, the I/O module may instead serve as an interface between two different subsystems in the same device which operate using two different voltage domains.

At block 710, the I/O module level shifts the data from the core logic voltage domain to the intermediate voltage domain. In one embodiment, the I/O module uses three different voltage domains where the intermediate voltage domain defines a voltage range that is between the respective voltage ranges of the low and high voltage domains. In one example, the voltage ranges of the low, intermediate, and high voltage domains are continuous such that the maximum voltage of the low voltage domain is the minimum voltage of the intermediate voltage domain and the maximum voltage of the intermediate voltage domain is the minimum voltage of the high voltage domain.

At block 715, the I/O module level shifts the data from the intermediate domain to the low voltage domain and the high voltage domain. In one embodiment, the output of the level shifter (or shifters) used at block 710 may be split such that the output is coupled to both an up shifter for converting the data signal to the high voltage domain and a down shifter for converting the data signals to the low voltage domain. As such, the conversion from the intermediate voltage domain to the high voltage domain and the conversion form the intermediate voltage domain to the low voltage domain may be performed in parallel. Moreover, by shifting the data signal from the low to intermediate voltage domains at block 710 and shifting the data signal from the intermediate voltage domain back down to the low voltage domain, the I/O module may maintain the synchronization or alignment of the data signals such that the two data signals convey the same data even though the data signals are in different voltage domains.

At block 720, the I/O module generates output data signals using the data in the low voltage domain and the data signals in the high voltage domain. For example, the I/O module may include a driver circuit that uses the two data signals to generate the output data signal in the voltage domain of the communication technique used to transmit the data signal to the external device.

Figure 8:
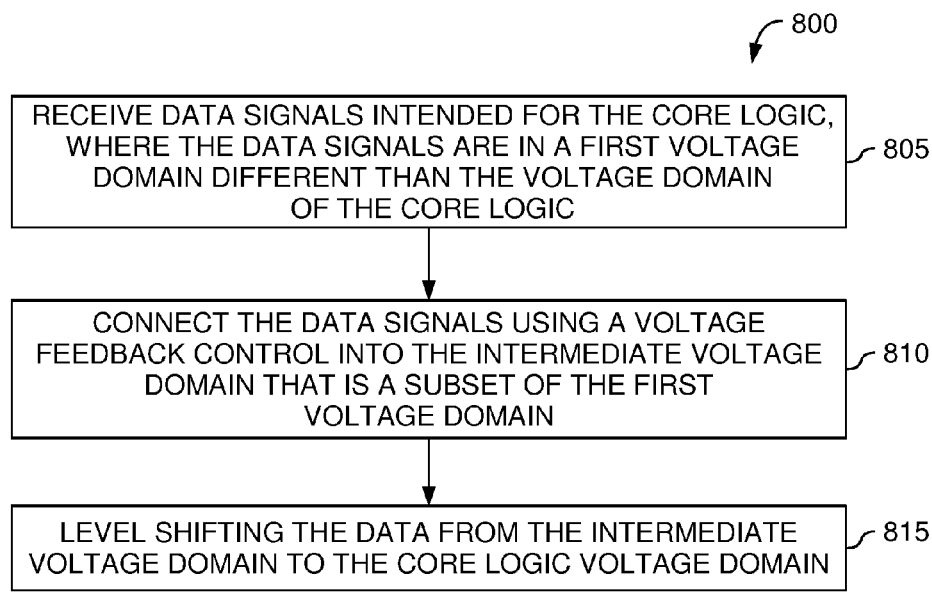
FIG. 8 is a flowchart for level shifting a received data signal into different voltage domains, according to one embodiment described herein.

FIG. 8 is a flowchart 800 for level shifting a received signal into a different voltage domain, according to one embodiment described herein. At block 805, the I/O module receives data signals intended for the core logic that are in a first voltage domain that is different from the voltage domain of the core logic. For example, the first voltage domain may be the voltage domain used by the communication technique that transmitted the data signals to the I/O module or the voltage domain of an external device coupled to the I/O module.

At block 810, the I/O module converts the received data signals using the voltage feedback control into the intermediate voltage domain. In one embodiment, the voltage range of the intermediate voltage domain is a subset of the voltage range of the first voltage domain. For example, the voltage range of the first voltage domain may be between system ground and 3.3V while the voltage range of the intermediate voltage range is between 1-2V. Further still, the range of the intermediate voltage domain may be centered within the range of the first voltage domain. Using the example above, the voltage range of the intermediate voltage domain may be between approximately 1.1-2.2V. As such, both the first and intermediate voltage domains are centered at the same voltage—i.e., 1.65V. By doing so, the receiver circuit used to detect the signals in the I/O module may have reduced complexity when compared to a receiver circuit that uses a non-centered voltage domain. At block 815, the I/O module shifts the data signals from the intermediate voltage domain to the voltage domain of the core logic.

While the foregoing is directed to embodiments of the present invention, other and further embodiments of the invention may be devised without departing from the basic scope thereof, and the scope thereof is determined by the claims that follow.

What is claimed is:

1. An I/O module, comprising:
   an n-type transistor;
   a p-type transistor, wherein a drain of the p-type transistor is coupled to a drain of the n-type transistor;
   an I/O pad electrically coupled to the drains of the p-type and n-type transistors, the I/O pad is configured to receive a first data signal in a first voltage domain;
   a voltage feedback control circuit configured to:
      apply a gate signal to both gates of the p-type and n-type transistors, and
      control the gate signal such that a voltage of the gate signal follows a voltage of the first data signal unless the voltage of the first data signal exceeds an upper limit voltage and unless the voltage of the first data signal falls below a lower limit voltage, the upper and lower limit voltages defining an intermediate voltage domain;
   a receiver circuit configured to output a second data signal responsive to receiving the gate signal from the voltage feedback circuit; and
   a level shifter configured to covert the second data signal into a second voltage domain, wherein the converted data signal carries the same data as the first data signal.

2. The I/O module of claim 1, wherein the voltage feedback control circuit is configured to:
   maintain the voltage of the gate signal at the upper limit voltage when the voltage of the first data signal exceeds the upper limit voltage; and
   maintain the voltage of the gate signal at the lower limit voltage when the voltage of first data signal falls below the lower limit voltage.

3. The I/O module of claim 1, wherein the level shifter is configured to transmit the converted data signal core logic of an integrated circuit, wherein the second voltage domain is a core logic voltage domain and is different from the first voltage domain.

4. The I/O module of claim 1, wherein the receiver circuit is a Schmitt trigger.

5. The I/O module of claim 1, further comprising a direct electrical connection between the I/O pad and the voltage feedback control circuit.

6. The I/O module of claim 1, further comprising:
   at least two additional n-type transistors connected in series to the n-type transistor; and
   at least two additional p-type transistors connected in series to the p-type transistor.

7. The I/O module of claim 1, wherein the intermediate voltage domain includes a smaller range of voltages than the first voltage domain and the second voltage domain includes a smaller range of voltages than the intermediate voltage domain.

8. An integrated circuit, comprising:
   core logic; and
   an I/O module communicatively coupled to the core logic, the I/O module comprising:
      an n-type transistor;
      a p-type transistor, wherein a drain of the p-type transistor is coupled to a drain of the n-type transistor;
      an I/O pad electrically coupled to the drains of the p-type and n-type transistors, the I/O pad is configured to receive a first data signal in a first voltage domain;
      a voltage feedback control circuit configured to:
         generate a gate signal to control both gates of the p-type and n-type transistors, and
         control the gate signal such that a voltage of the gate signal follows a voltage of the first data signal unless the voltage of the first data signal exceeds an upper limit voltage and unless the voltage of the first data signal falls below a lower limit voltages, the upper and lower limit voltage defining an intermediate voltage domain;
      a receiver circuit configured to output a second data signal responsive to receiving the gate signal from the voltage feedback circuit; and
      a level shifter configured to covert the second data signal into a second voltage domain, wherein the converted data signal carries the same data as the first data signal.

9. The integrated circuit of claim 8, wherein the voltage feedback control circuit is configured to:
- maintain the voltage of the gate signal at the upper limit voltage when the voltage of the first data signal exceeds the upper limit voltage; and
- maintain the voltage of the gate signal at the lower limit voltage when the voltage of first data signal falls below the lower limit voltage.

10. The integrated circuit of claim 8, wherein the receiver circuit is a Schmitt trigger.

11. The integrated circuit of claim 8, wherein the I/O module further comprises a direct electrical connection between the I/O pad and the voltage feedback control circuit.

12. The integrated circuit of claim 8, wherein the I/O module further comprises further comprises:
- at least two additional n-type transistors connected in series to the n-type transistor; and
- at least two additional p-type transistors connected in series to the p-type transistor.

13. The integrated circuit of claim 8, wherein the intermediate voltage domain includes a smaller range of voltages than the first voltage domain and the second voltage domain includes a smaller range of voltages than the intermediate voltage domain.

* * * * *